US008389987B2

(12) United States Patent
Toguchi et al.

(10) Patent No.: US 8,389,987 B2
(45) Date of Patent: Mar. 5, 2013

(54) SWITCHING ELEMENT AND METHOD FOR FABRICATING SAME (75) Inventors: Satoru Toguchi, Tokyo (JP); Hiroyuki Endoh, Tokyo (JP)

(73) Assignee: NEC Corporation, Tokyo (JP)

( * ) Notice: Subject to any disclaimer, the term of this patent is extended or adjusted under 35 U.S.C. 154(b) by 125 days.

(21) Appl. No.: 13/127,761

(22) PCT Filed: Nov. 9, 2009

(86) PCT No.: PCT/JP2009/069033
§ 371 (c)(1),
(2), (4) Date: May 5, 2011

(87) PCT Pub. No.: WO2010/053171
PCT Pub. Date: May 14, 2010

(65) Prior Publication Data
US 2011/0215315 A1    Sep. 8, 2011

(30) Foreign Application Priority Data

Nov. 10, 2008   (JP) ................................. 2008-287707

(51) Int. Cl.
*H01L 29/08* (2006.01)
(52) U.S. Cl. ................. 257/40; 257/57; 257/59; 257/66; 257/72; 438/48; 438/99
(58) Field of Classification Search .................. None
See application file for complete search history.

(56) References Cited

U.S. PATENT DOCUMENTS

2003/0047729 A1* 3/2003 Hirai et al. ....................... 257/40
2007/0031990 A1  2/2007 Maekawa
2007/0176202 A1  8/2007 Inoue et al.

FOREIGN PATENT DOCUMENTS

| JP | 2005-125428 A | 5/2005 |
| JP | 2005-347378 A | 12/2005 |
| JP | 2006-73774 A | 3/2006 |
| JP | 2006-100808 A | 4/2006 |
| JP | 2007-208009 A | 8/2007 |
| JP | 2008-227417 A | 9/2008 |
| WO | 2007/126412 A2 | 11/2007 |

OTHER PUBLICATIONS

Snow, E.S., et al., "Random networks of carbon nanotubes as an electronic material," Applied Physics Letters, Mar. 31, 2003, pp. 1-3, vol. 82, No. 13.
Artukovic, E., et al., "Transparent and Flexible Carbon Nanotube Transistors," Nano Letters, 2005, pp. 757-760, vol. 5, No. 4.
Hur, Seung-Hyun, et al., "Extreme bendability of single-walled carbon nanotube networks transferred from high-temperature growth substrates to plastic and their use in thin-film transistors," Applied Physics Letters, 2005, pp. 243502-1-243502-3, vol. 86.
Takenobu, Taishi, et al., "High-performance transport flexible transistors using carbon nanotube films," Applied Physics Letters, 2006, pp. 033511-1-033511-3, vol. 88.

* cited by examiner

*Primary Examiner* — Kyoung Lee
(74) *Attorney, Agent, or Firm* — Sughrue Mion, PLLC (57) ABSTRACT A switching element comprises a source electrode, a drain electrode arranged apart from the source electrode, an active layer in contact with the electrodes, and a gate electrode arranged apart from the source and drain electrodes and being in contact with the active layer with a gate insulating layer interposed therebetween. The active layer is formed of a dispersion film containing predetermined carbon nanotubes and a predetermined polyether compound.

12 Claims, 6 Drawing Sheets

SWITCHING ELEMENT AND METHOD FOR FABRICATING SAME

CROSS REFERENCE TO RELATED APPLICATIONS

This application is a National Stage of International Application No. PCT/JP2009/069033 filed Nov. 9, 2009, claiming priority based on Japanese Patent Application No. 2008-287707, filed Nov. 10, 2008, the contents of all of which are incorporated herein by reference in their entirety.

TECHNICAL FIELD (Related application) This application claims the benefit of Japanese Patent Application No. 2008-287707, filed Nov. 10, 2008, which is hereby incorporated by reference herein in its entirety. This invention relates to a switching element and a method for fabricating the switching element.

BACKGROUND ART

A switching element such as a thin film transistor (TFT) is widely used for a picture element switch for a display device such as a liquid crystal display or an EL display. Recently, a case is increasing that a driver circuit for a picture element array is also formed by a TFT on the same substrate.

Generally such a TFT is formed on a glass substrate using an amorphous or polycrystalline silicon. However, there was a problem that it needs increasing cost to fabricate a display device using such silicon materials of a large area because a chemical vapor deposition (CVD) device used for fabricating such a TFT made of silicon is rather expensive. In addition, there was a problem that a substrate was limited on a material, such that a light resin substrate could not be used, because the process to form an amorphous or polycrystalline silicon film is performed at a very high temperature.

To solve such problems, a TFT using a carbon nanotube (CNT) as a semiconductor material is proposed. The practical application of such a TFT using a CNT dispersion film is expected because of merits that a CNT dispersion film is generally formed by a wet process such as an application method and the process can realize a large dispersion film in area at low cost, and selection of a material for a substrate is less restricted because the process temperature is low.

Recently many reports relating to a TFT using a CNT dispersion film are published such as Non-Patent Documents 1 to 4. Also Patent Documents 1 to 3, for example, disclose techniques using a carbon nanotube. The method for preparing a carbon nanotube structure disclosed in Patent Document 1 is "a method including a purification step of a carbon nanotube for preparing a carbon nanotube structure, in which the purification step is to carboxylate a carbon nanotube and react the carbon nanotube with a compound having at least two functional groups that react with a carboxylic group".

According to Patent Document 1, a purification yield can be remarkably increased because carbon nanotubes are combined to increase the weight (or size) so as to make it easy to recover them and improve the amount of recovered carbon nanotube. It is also described that a carbon nanotube structure can be achieved, in which weight-increased or chemically modified carbon nanotubes are precisely arranged.

The method for forming a pattern of nano-carbon materials disclosed in Patent Document 2 is "a method for forming a pattern of nano-carbon materials layer including a step of forming a nano-carbon materials layer on a substrate, a step of forming a desired pattern of a first metal layer composed of at least a metal selected from the group consisting of zinc, tin, indium, aluminum and titanium on the nano-carbon materials layer, and a step of etching the nano-carbon materials layer by oxygen plasma with a mask of the first metal layer as a positive pattern".

According to Patent Document 2, it is described that a desired pattern of nano-carbon materials can be formed without deterioration or damage of the nano-carbon materials and thus it is possible to provide high performance semiconductor devices such as an electromagnetic field effect transistor or FED by applying nano-carbon materials.

A thin film transistor disclosed in Patent Document 3 is composed of "an insulating substrate having a uniform thickness and a first main surface and a second main surface both being flat, a gate electrode formed on the first main surface of the insulating substrate, a channel layer formed on the second main surface of the insulating substrate and structured by an organic semiconductor, carbon nanotube, or an organic dispersion material containing at least carbon nanotube, and a source electrode and a drain electrode formed so as to position on both sides of the gate electrode and on the channel layer or between the channel layer and the insulating substrate".

According to Patent Document 3, it is described that a thin film transistor having stable characteristics can be realized because the insulating substrate as a gate insulating layer has an even thickness and both of the main surfaces are flat, and thus capacity components are uniform in the surface of the substrate. Also it is described that a reliable thin film transistor having improved characteristics of migration degree of carrier in the channel layer and an ON/OFF ratio of current can be achieved because the insulating substrate serves for a gate insulating layer and the channel layer is formed on the second main flat surface that is opposite to the first main surface on which the gate electrode is formed, and thus an evenness of the film thickness of the channel layer is improved. In addition, it is described that the cost can be reduced due to decreased structural elements and fabrication steps because the insulating substrate serves also as a gate insulating layer.

[Patent Document 1]
  Japanese Patent Kokai Publication No. JP-2005-125428A
[Patent Document 2]
  Japanese Patent Kokai Publication No. JP-2005-347378A
[Patent Document 3]
  Japanese Patent Kokai Publication No. JP-2006-73774A
[Non-Patent Document 1] E. S. Snow, J. P. Novak, P. M. Campbell, D. Park, Applied Physics Letters, vol. 82, p. 2145, 2003.
[Non-Patent Document 2] E. Artukovic, M. Kaempgen, D. S. Hecht, S. Roth, G. Grner, Nano Letters, vol. 5, p. 757, 2005.
[Non-Patent Document 3] S.-H. Hur, O. O. Park, J. A. Rogers, Applied Physics Letters, vol. 86, p. 243502, 2005.
[Non-Patent Document 4] T. Takenobu, T. Takahashi, T. Kanbara, K. Tsukagoshi, Y. Aoyagi, Y. Iwasa, Applied Physics Letters, vol. 88, p. 33511, 2006.

SUMMARY

It should be noted that the contents disclosed in Patent Documents 1 to 3 and Non-Patent Documents 1 to 4 are hereby incorporated by reference herein in their entirety. The following analyses are given by the present invention.

To make a CNT film, by an application method, that is suitable for a transistor channel, it is necessary to prepare an application solution in which CNT is sufficiently dispersed. Because CNT has strong aggregation characteristics, it is necessary to add a dispersion agent to form and keep a sufficient dispersion state. Because molecules of such a dispersion agent exist in the solution and on the surface of the CNT in a specified ratio, to increase molecules of the dispersion agent working on the CNT surface effectively, it was necessary to increase molecules of the dispersion agent existing in the solution freely as well at the same time by increasing the total concentration of the dispersion agent.

However, such a dispersion agent remains in a channel film after forming the film and causes increasing of a contact resistance between CNTs or stagnation of electric charges, and may deteriorate the transistor characteristics. Thus a method has been desired to obtain enough dispersion state with a low amount of addition as possible.

It is an object of the present invention to provide a switching element exhibiting good and stable transistor characteristics and a fabrication method of the element by a simple process at a low temperature and low cost.

According to a first aspect of the present invention, there is provided a switching element comprising: a source electrode, a drain electrode arranged apart from the source electrode, an active layer in contact with the electrodes, and a gate electrode arranged apart from the source and drain electrodes and being in contact with the active layer with a gate insulating layer interposed therebetween, wherein the active layer is formed of a dispersion film containing predetermined carbon nanotubes and a predetermined polyether compound.

The gate electrode, the source electrode and the drain electrode of the switching element can be formed using a printing method or an application method.

According to a second aspect of the present invention, there is provided a fabrication method (first method) of a switching element. The first method comprises the steps of: preparing a supporting substrate, forming an aluminum film as a gate electrode using a sputtering method through a shadow mask on the supporting substrate, applying a gate insulating film using a spin coating method on the supporting substrate and the gate electrode, baking (heating) the supporting substrate applied with the gate insulating film, forming a film for a source electrode and a drain electrode on the calcinated supporting substrate, patterning the film on the supporting substrate for the electrodes using a lift-off method, and forming an active layer of a dispersion film by applying a dispersion solution containing predetermined carbon nanotubes and a predetermined polyether compound using a casting method.

According to a third aspect of the present invention, there is provided another fabrication method (second method) of a switching element. The second method comprises the steps of: preparing a supporting substrate, forming a gate electrode by a silver paste using a dispenser method on the supporting substrate, applying a gate insulating film using a dispenser method on the supporting substrate, calcinating the supporting substrate applied with the gate insulating film, forming an active layer of a dispersion film by applying a dispersion solution containing predetermined carbon nanotubes and a predetermined polyether compound using a casting method, patterning the film on the supporting substrate for the electrodes using a lift-off method, and forming a drain electrode and a source electrode.

According to a fourth aspect of the present invention, there is provided a further fabrication method (third method) of a switching element. The third method comprises the steps of: preparing a supporting substrate, forming an active layer of a dispersion film by applying a dispersion solution containing predetermined carbon nanotubes and a predetermined polyether compound using a casting method, forming a drain electrode and a source electrode on the active layer, forming a gate insulating film on the active layer, the drain electrode and the source electrode, and forming a gate electrode on the gate insulating film.

According to each aspect of the present invention, a switching element exhibiting good and stable transistor characteristics and a fabrication method of the element by a simple process at a low temperature and low cost can be provided.

PREFERRED MODES

The inventors of the present invention have researched to solve the problem and found that it becomes possible to obtain good dispersion state by a small amount of dispersion agent added and good transistor characteristics of CNT by combining CNT having a specified functional group in certain concentration on a surface of the CNT and a dispersion agent having a specified polyether structure, and having the dispersion agent concentrate more effectively on the surface of the CNT with the aid of an interaction between an oxygen atom of the ether bonding and the functional group.

According to an exemplary embodiment of the present invention, there is provided a switching element having a source electrode and a drain electrode apart from each other, an active layer in contact with the electrodes, and a gate electrode arranged apart from the source and drain electrodes and being in contact with the active layer with a gate insulating layer interposed therebetween. The active layer is formed by a dispersion film formed by applying a dispersion solution, which carbon nanotubes are dispersed in a liquid dispersion solvent, and then removing the dispersion solvent. The dispersion solution contains carbon nanotubes having a functional group containing 0.1 to 10 mmol of carbonyl group per 1 g and a polyether compound expressed by the following chemical formula (I). In the formula, each of R and R' is a substituted or non-substituted alkyl group having 1 to 20 carbon atoms, X is simple bonding or an alkylene group having 1 to 2 carbon atoms, and n is 2 to 100.

(1)

According to an exemplary embodiment of the present invention, preferably the functional group containing a carbonyl group is a carboxyl group, an ester group or an amide group, or combination thereof.

According to an exemplary embodiment of the present invention, preferably the dispersion solvent is water.

According to an exemplary embodiment of the present invention, preferably the gate electrode, the source electrode and the drain electrode are formed using a printing method or an application method.

Exemplary Embodiment 1

Figure 1:
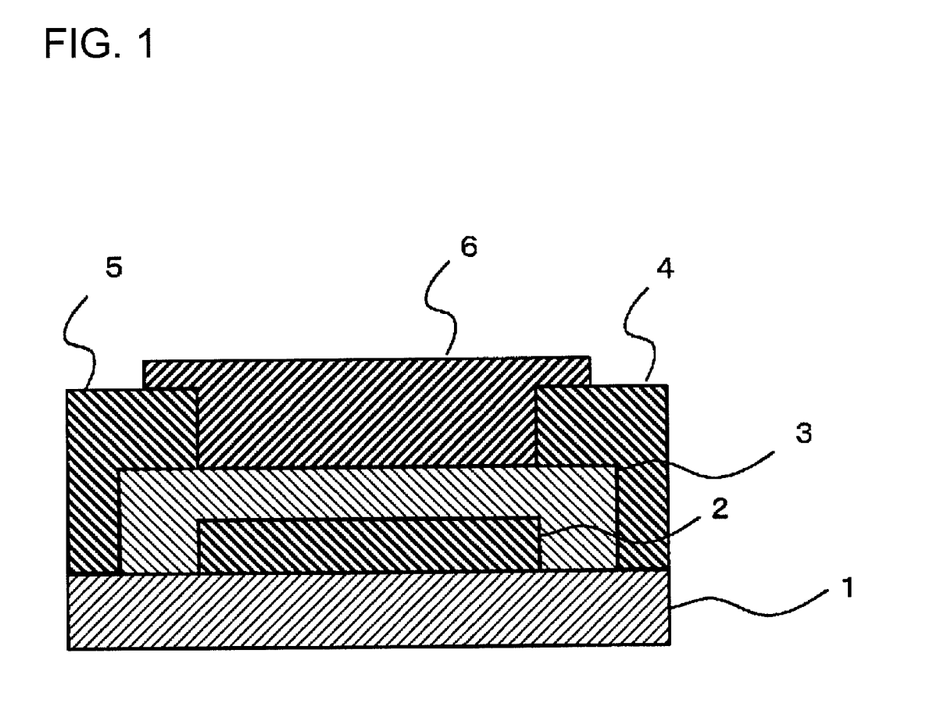
FIG. 1 is a structural view illustrating an exemplary embodiment of a switching element of the present invention.

A structure of a switching element according to an exemplary embodiment of the present invention will be explained. FIG. 1 is a structural view illustrating an exemplary embodiment of a switching element of the present invention. A gate insulating film 3 is formed so as to cover a gate electrode 2 formed on a supporting substrate 1. A source electrode 4 and a drain electrode 5 are disposed at a interval corresponding to a channel length. Further, a CNT dispersion film as an active layer 6 is disposed so as to contact with the gate insulating film 3, the source electrode 4 and the drain electrode 5 to obtain a switching element according to an exemplary embodiment of the present invention.

Exemplary Embodiment 2

Figure 2:
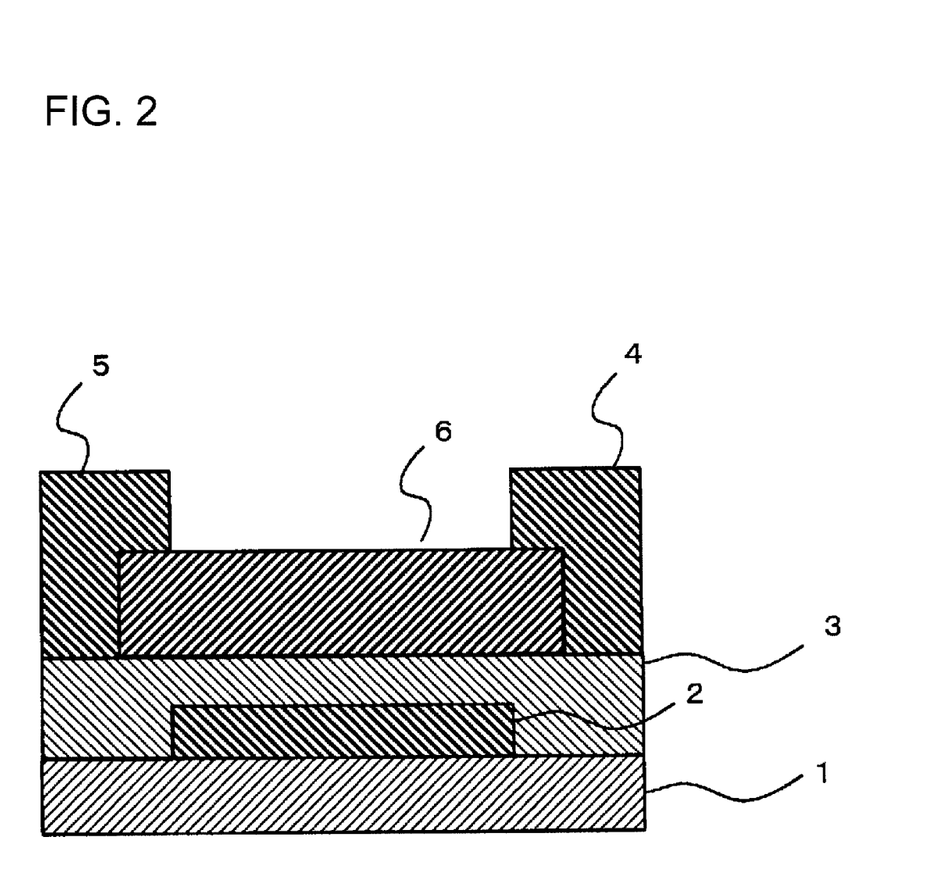
FIG. 2 is a structural view illustrating another exemplary embodiment of a switching element of the present invention.

FIG. 2 is a structural view illustrating another exemplary embodiment of a switching element of the present invention. A gate insulating film 3 is formed so as to cover a gate electrode 2 formed on a supporting substrate 1. After disposing a CNT dispersion film as an active layer 6 on the gate insulating film 3, a source electrode 4 and a drain electrode 5 are disposed at an interval corresponding to a length of the channel to obtain a switching element according to an exemplary embodiment of the present invention.

Exemplary Embodiment 3

Figure 3:
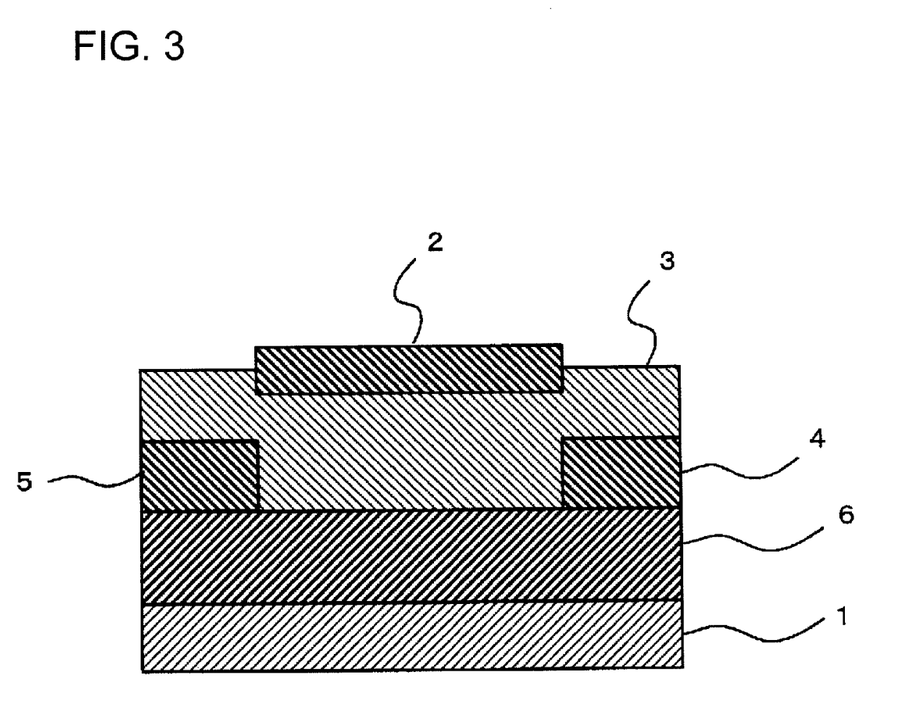
FIG. 3 is a structural view illustrating a further exemplary embodiment of a switching element of the present invention.

FIG. 3 is a structural view illustrating a further exemplary embodiment of a switching element of the present invention.

A CNT dispersion film is formed as an active layer 6 on a supporting substrate 1. A source electrode 4 and a drain electrode 5 are disposed at an interval corresponding to a channel length. Further, a gate insulating film 3 is formed on an area corresponding to the channel and a gate electrode 2 is formed on the gate insulating film 3 to obtain a switching element according to an exemplary embodiment of the present invention.

As for a supporting substrate 1 for a switching element of the present invention, any material can be used as far as a switching element can be formed on it.

For example, a polymer material such as a polyethylene resin group such as polyethylene sulfide, polyethylene naphthalate and polyethylene terephthalate, polyamide group, polyimide group, and polycarbonate group as well as an inorganic material such as glass, quartz and silicon wafer can be used, but not limited to them.

As for a material used for an electrode for a source, drain or gate electrode of a switching element of the present invention, any material can be used as far as it has enough conductivity; however, for an electrode acting as a charge feeding (injecting) electrode, a material having a superior charge feeding (injecting) characteristics to CNT is more preferable.

For example, a metal or alloy such as indium-tin oxide (ITO), tin oxide (trade name: NESA), gold, silver, platinum, copper, indium, aluminum, magnesium, magnesium-indium alloy, magnesium-aluminum alloy, aluminum-lithium alloy and magnesium-silver alloy, an oxide thereof and an organic material such as a conductive polymer can be used, but not limited to them.

There is no limitation of a fabrication method of source, drain and gate electrodes of a switching element of the present invention. It is possible to use a generally known thin film fabrication method such as a vacuum vapor deposition method, spin coating method, sputtering method, CVD method, application method and application-sintering method. A photo-lithography method as well as printing method can be used for patterning the electrodes, but not limited to them as far as it can realize a desired electrode pattern. However, a wet method such as a printing or application method is more preferable from the viewpoint of simplicity of its process and for decreasing environmental burden by reducing energy consumption.

As for a material for insulating film of a switching element of the present invention, a high dielectric material such as titanium oxide, tungsten oxide or tantalum oxide as well as an inorganic insulator such as $SiO_2$, SiNx or aluminum oxide can be used. In addition, an insulating polymer such as polyimide, polyethylene naphthalate and polyethylene terephthalate can be used. As for a fabrication method of an insulating film, a generally known fabrication method for a thin film can be used including a dry process such as a vacuum vapor deposition method, sputtering method or CVD method, application method or application-sintering method, and printing method such as an ink-jet method.

A CNT that can be used for the switching element according to the present invention is not particularly limited as far as it has a functional group containing a carbonyl group of 0.1 to 10 mmol per 1 g and possesses sufficient semiconductor characteristics in a form of dispersion film. A method to form a skeletal structure of a CNT is not particularly limited, and any CNT structure that can be obtained by a conventional forming method such as an arc discharge method, laser abrasion method or CVD method can be used.

Two types of CNTs are known in general, one is a single wall nanotube (SWNT) composed of a single carbon layer and the other is a multiple-wall nanotube (MWNT) composed of a plurality of carbon layers. There are two kinds of the SWNT, one has a property of semiconductor and the other has a metallic property, and the MWNT is composed of random combination of them. It may be preferable, but not limited to it, that a ratio of the CNT exhibiting metallic property in a dispersion film is as small as possible for a use that requires low electric consumption because such a CNT exhibiting metallic property in a dispersion film may cause an increasing of off-state current.

The functional group of CNT containing a carbonyl group may include a carboxyl group, ester group, amide group, acid chloride group, acid anhydride group, ketone group and formyl group, and particularly the carboxyl group, ester group and amide group are preferable from the viewpoint of affinity to a polyether structure and stability of the functional group.

As to a method for determining an amount of the functional group containing a carbonyl group, a titration method disclosed in Non-Patent Document 5 is effective. A quantitative method using an infrared absorption spectrum may be also used. If the amount of the functional group is less than 0.1 mmol per 1 g, the interaction between the functional group and a dispersion agent having a polyether structure becomes insufficient and it is not possible to concentrate the dispersion agent on a surface of CNT.

On the other hand, if the amount of the functional group exceeds 10 mmol per 1 g, electrical characteristics may deteriorate when the CNT is formed into element because a defect density in the CNT skeletal structure becomes too large. Therefore, the amount of a functional group is preferably from 0.1 to 10 mmol per 1 g.

In a case where a CNT has functional groups containing a carbonyl group of only 0.1 mmol or less per 1 g, it is possible to introduce functional groups by a chemical treatment. A treatment method using a strong acid as shown in Reference 1, for example, is known for introducing functional groups containing a carbonyl group into CNT skeletal structure. However, any method may be possible as far as it can introduce functional groups containing a carbonyl group in a specified concentration.

(Reference 1) Yong-Tae Kim, Yoshiki Ito, Kenji Tadai, Tadaoki Mitani, Un-Seok Kim, Hyung-Sun Kim, Byung-Won Cho, Applied Physics Letters, vol. 87, 234106, 2005.

The content disclosed in Reference 1 is incorporated by reference herein in its entirety.

The dispersion agent having a polyether structure used for the present invention is expressed by the following chemical formula (1).

(1)

In the chemical formula (1), each of R and R' is a substituted or non-substituted alkyl group having 1 to 20 carbon atoms, X is simple bonding or an alkylene group having 1 to 2 carbon atoms, and n is 2 to 100. Such a dispersion agent may be polyoxyethylene (20) cetylether, polyoxyethylene (23) laurylether, polyoxyethylene (8) octylphenylether, polyoxyethylene (10) octylphenylether, polyoxyethylene (100) stearylether, polyoxyethylene (20) stearylether, polyoxyethylene (20) polyoxypropylene (4) cetylether, and the like; however, a dispersion agent is not limited to them as far as it has a structure shown by chemical formula (1).

Liquid dispersion solvent for dispersing CNT may be, for example, a general organic solvent such as alcohols, ethers, esters, alkylamides, aliphatic hydrocarbons and aromatic hydrocarbons as well as water. However, water is preferable as a dispersion solvent to utilize effectively an effect of an interaction between a dispersion agent having a polyether structure and functional groups on the CNT. As to dispersing method, a kneading method such as stirring or milling may be used. In addition, any method that can be used for dispersing pigments may be used such as an ultrasonic mixing method.

For disposing CNT in a channel region as a dispersion film, a wet method may be used such that the CNT is dispersed in a solvent and the dispersion liquid is applied or sprayed. As for an application method or spraying method, a dropping by a dispenser or a printing method such as an ink jet method may be used as well as a film formation method such as a spin coating method or blade coating method.

According to exemplary embodiments aforementioned, a switching element exhibiting good and stable transistor characteristics can be obtained by simple processes at low cost.

It is to be understood that the invention is not limited to the specific exemplary embodiments and that modifications may be done without departing the gist and scope of the present invention.

Next, examples of the present invention will be explained.

EXAMPLE 1

An example of a fabrication method of a switching element of the present invention will be explained.

FIGS. 4A to 4E are process views illustrating an example of a fabrication method of a switching element of the present invention. The process steps for fabricating a switching element will be explained.

Figure 4A:
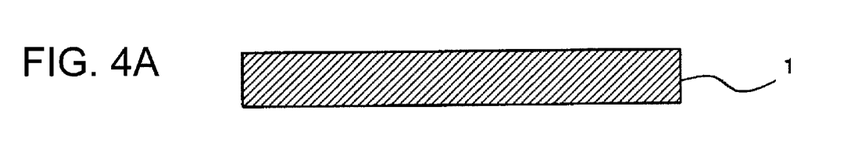
FIGS. 4A to 4E are process views illustrating an example of a fabrication method of a switching element of the present invention.
Figure 4B:
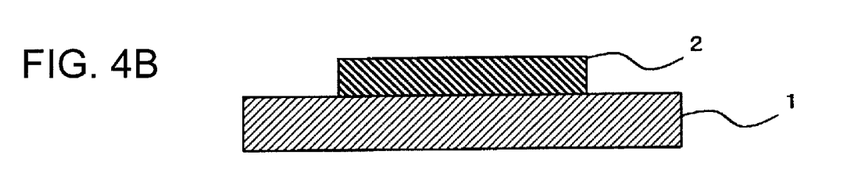

A polyimide substrate as a supporting substrate 1 having a thickness of 0.5 mm, for example, was prepared (FIG. 4A) and an aluminum film with a thickness of 100 nm was formed as a gate electrode 2 on the polyimide substrate using a sputtering method through a shadow mask (not shown) (FIG. 4B).

Figure 4C:
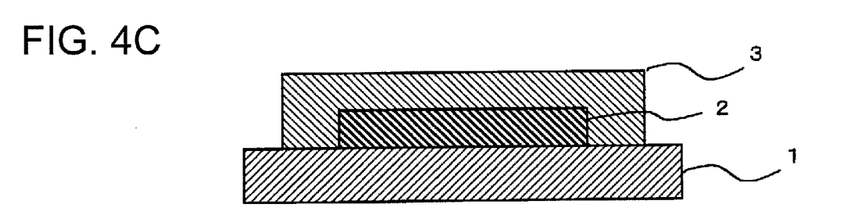

A Chemitight (CT4112, produced by Kyocera Chemical Corporation) was applied by a spin coating method on the supporting substrate 1 as a gate insulating film 3 and baked (heated) at 180 degrees C., for example, to obtain a film having a thickness of 500 nm (FIG. 4C).

Figure 4D:
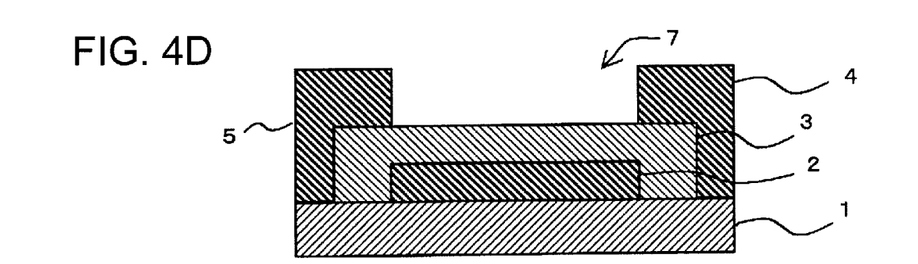

A source electrode 4 and a drain electrode 5 were formed on the gate insulating film 3 and the supporting substrate 1 by vapor-depositing gold at a film thickness of 60 nm using a vacuum vapor deposition method and patterning the film using a lift off method (FIG. 4D).

Figure 4E:
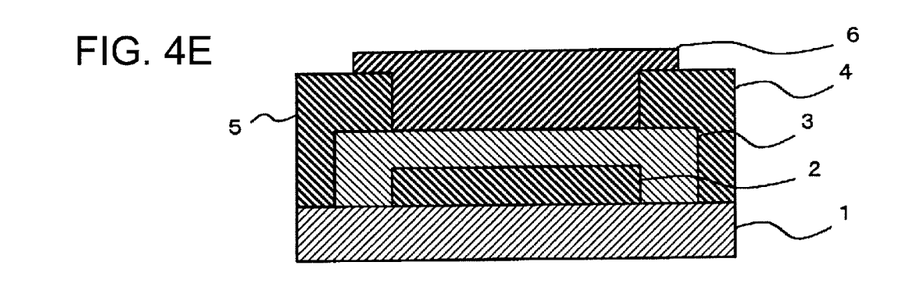
Figure 5A:
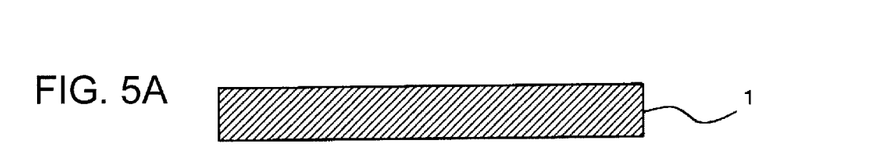
FIGS. 5A to 5E are process views illustrating another example of a fabrication method of a switching element of the present invention.
Figure 5B:
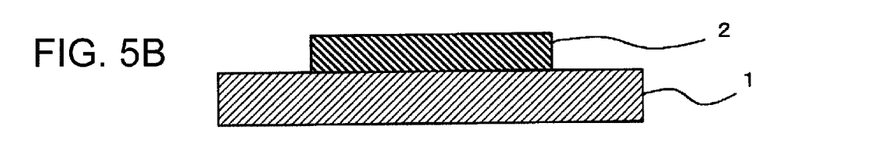
Figure 5C:
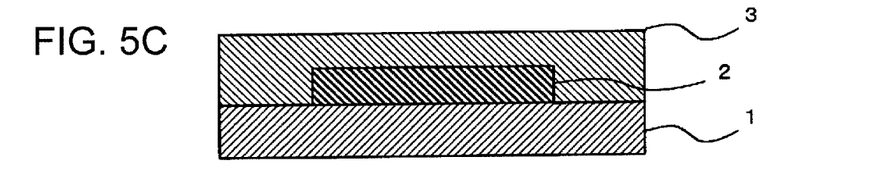
Figure 5D:
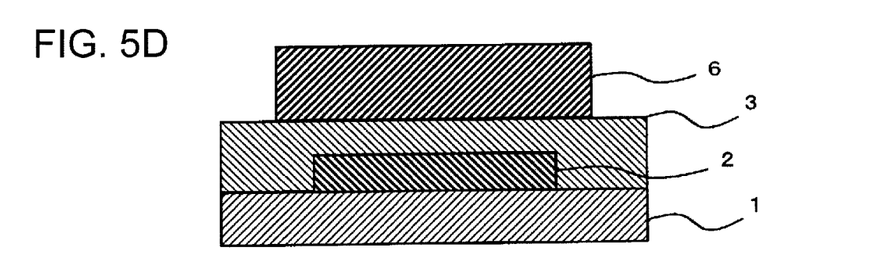
Figure 5E:
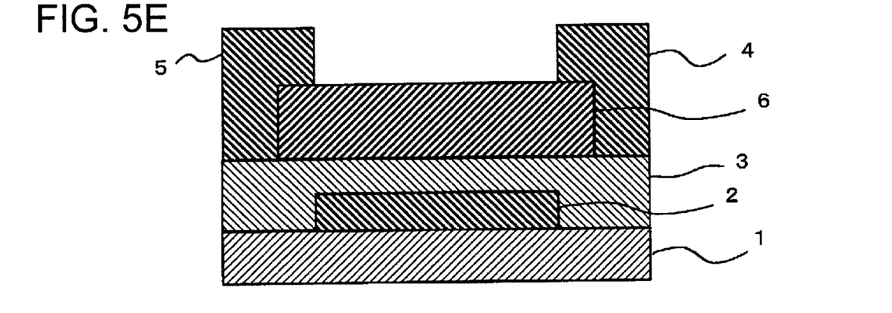
Figure 6A:
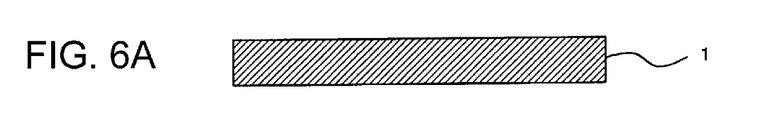
FIGS. 6A to 6E are process views illustrating a further example of a fabrication method of a switching element of the present invention.
Figure 6B:
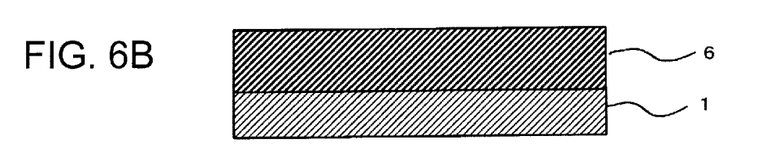
Figure 6C:
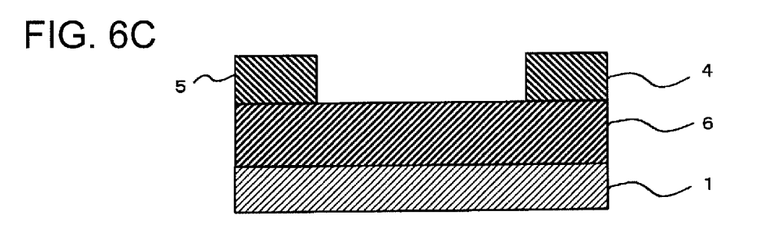
Figure 6D:
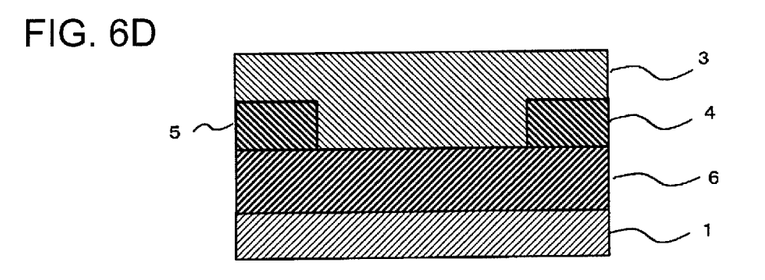
Figure 6E:
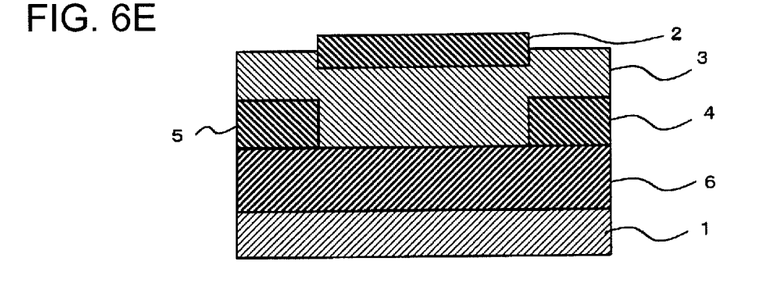

A channel width of the formed electrode structure is 500 μm and a channel length is 300 μm. Further, a CNT dispersion film as an active layer 6 was formed on the channel 7 by applying a dispersion solution, which was obtained by adding 2.5 mg of SWNT (SG65, CoMoCAT) and 25 mg of polyoxyethylene (100) stearylether to 100 g of water followed by ultrasonic treatment, using a casting method by six times, for example, while heating the supporting substrate 1 at the temperature of 100 degrees C., for example (FIG. 4E).

In the SWNT (SG65, CoMoCAT), two peaks were observed at 1635 $cm^{-1}$ and 1800 $cm^{-1}$ in an infrared spectrum that correspond to a carbonyl group and a carboxylic group, respectively. An amount of functional groups was measured as 1.9 mmol per 1 g using the titration method aforementioned. No aggregation of CNT was observed visually in the dispersion solution after ultrasonic treatment.

The transistor characteristics of the switching element prepared in such a way were measured. An on/off ratio (a ratio of current between source and drain at the following condition: source/drain bias was −2 V, and gate voltage was −20 V at on state and +20 V at off state, hereinafter the same) was $3.2 \times 10^3$ and the current at on state was 11 nA.

Comparative Example 1

A CNT dispersion solution was prepared using SWNT as the CNT made by CVD method.

No peak corresponding to a carbonyl group was observed at 1650 $cm^{-1}$ in the infrared spectrum of the SWNT. An amount of the functional groups was measured as 0.05 mmol per 1 g using the titration method aforementioned. 2.5 mg of the SWNT and 25 mg of polyoxyethylene (100) stearylether were added with 100 g of water and ultrasonic treated. After 1 hour of ceasing of the ultrasonic irradiation, aggregation of the CNT was observed visually. 100 mg of polyoxyethylene (100) stearylether was further added and ultrasonic treated. Then no aggregation of the CNT was observed visually.

A switching element of a comparative example 1 was obtained by forming a CNT dispersion film using the dispersion solution obtained above on a substrate prepared by the same manner as Example 1, on which a gate electrode, gate insulating film, source electrode and drain electrode were formed. The transistor characteristics of the switching element obtained above were measured and found that an on/off ratio was $1.1 \times 10^1$ and the current at on state was 500 pA.

EXAMPLE 2

Another example of a fabrication method of a switching element of the present invention will be explained.

FIGS. 5A to 5E are process views illustrating another example of a fabrication method of a switching element of the present invention. A gate electrode 2, drain electrode 5 and source electrode 4 were formed by a conductive film having a thickness of 120 nm formed by a silver paste using a dispenser method, and a gate insulating film 3 was formed such that a chemitight (CT4112, Kyocera Chemical Corporation) was applied using a dispenser method and fired at 180 degrees C. to form a film having a thickness of 800 nm. Other steps were performed by the same manner as Example 1 to form the switching element (FIG. 5A to 5E).

The transistor characteristics of the switching element obtained above were measured and found that an on/off ratio was $1.3 \times 10^3$ and the current at on state was 25 nA.

EXAMPLE 3

Next, a further example of a fabrication method of a switching element of the present invention will be explained.

FIGS. 6A to 6E are process views illustrating a further example of a fabrication method of a switching element of the present invention.

A switching element was fabricated by the same manner as Example 2 except that a polyoxyethylene (20) polyoxypropylene (4) cetylether was used as a dispersion agent instead of a polyoxyethylene (100) stearylether (FIG. 6A to 6E).

The transistor characteristics of the switching element obtained above were measured and found that an on/off ratio was $1.2 \times 10^3$ and the current at on state was 10 nA.

Comparative Example 2

A switching element was fabricated by the same manner as Example 1 except that a sodium dodecyl sulfate was used as a dispersion agent. The transistor characteristics of the switching element obtained above were measured and found that an on/off ratio was $1.02 \times 10^1$ and the current at on state was 2 μA.

It is to be understood that the invention is not limited to the specific examples and that modifications may be done without departing the gist and scope of the present invention.

The contents disclosed in Patent Documents are hereby incorporated by reference herein in their entirety. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

EXPLANATIONS OF SYMBOLS 1 supporting substrate
2 gate electrode
3 gate insulating film
4 source electrode
5 drain electrode
6 active layer
7 channel

The invention claimed is:

1. A switching element comprising:
a source electrode, a drain electrode arranged apart from the source electrode, an active layer in contact with the electrodes, and a gate electrode arranged apart from the source and drain electrodes and being in contact with the active layer with a gate insulating layer interposed therebetween, wherein;
the active layer is formed of a dispersion film containing carbon nanotubes having a functional group containing a carbonyl group and a predetermined polyether compound.

2. The switching element according to claim 1, wherein;
the carbon nanotubes have a functional group containing 0.1 to 10 mmol of carbonyl group per 1 g, and wherein;
the polyether compound is expressed by the following chemical formula (I) (where each of R and R' is a substituted or non-substituted alkyl group having 1 to 20 carbon atoms, X is simple bonding or an alkylene group having 1 to 2 carbon atoms, and n is 2 to 100)

(1)

3. The switching element according to claim 1, wherein the functional group containing a carbonyl group contains at least one of carboxyl group, ester group or amide group.

4. The switching element according to claim 1, wherein the dispersion solvent to form the dispersion film is water.

5. The switching element according to claim 1, wherein the gate electrode, the source electrode and the drain electrode are formed using a printing method or an application method.

6. A fabrication method of a switching element, comprising:
preparing a supporting substrate,
forming an aluminum film as a gate electrode using a sputtering method through a shadow mask on the supporting substrate,
applying a gate insulating film using a spin coating method on the supporting substrate and the gate electrode,
baking the supporting substrate applied with the gate insulating film,
forming a film for a source electrode and a drain electrode on the calcinated supporting substrate,
patterning the film on the supporting substrate for the electrodes using a lift-off method, and
forming an active layer of a dispersion film by applying a dispersion solution containing predetermined carbon nanotubes and a predetermined polyether compound using a casting method.

7. The fabrication method of a switching element according to claim 6, wherein;
the carbon nanotubes have a functional group containing 0.1 to 10 mmol of carbonyl group per 1 g, and wherein;
the polyether compound is expressed by the following chemical formula (I) (where each of R and R' is a substituted or non-substituted alkyl group having 1 to 20 carbon atoms, X is simple bonding or an alkylene group having 1 to 2 carbon atoms, and n is 2 to 100)

[Chemical Expression 2]

(1)

8. The fabrication method of a switching element according to claim 7, wherein the functional group containing a carbonyl group contains at least one of carboxyl group, ester group or amide group.

9. The fabrication method of a switching element according to claim 6, wherein said (forming an active layer of a) dispersion film comprises:
applying the dispersion solution in which the predetermined carbon nanotubes are dispersed in a liquid dispersion solvent, and
forming the dispersion film by removing the liquid dispersion solvent after applying the dispersion solution.

10. The fabrication method of a switching element according to claim 6, wherein water is used as a dispersion solvent for forming the dispersion film.

11. A fabrication method of a switching element, comprising:
preparing a supporting substrate,
forming a gate electrode by a silver paste using a dispenser method on the supporting substrate,
applying a gate insulating film using a dispenser method on the supporting substrate,
baking the supporting substrate applied with the gate insulating film,
forming an active layer of a dispersion film by applying a dispersion solution containing predetermined carbon nanotubes and a predetermined polyether compound using a casting method,
patterning the film on the supporting substrate for the electrodes using a lift-off method, and
forming a drain electrode and a source electrode.

12. A fabrication method of a switching element, comprising:
preparing a supporting substrate,
forming an active layer of a dispersion film by applying a dispersion solution containing predetermined carbon nanotubes and a predetermined polyether compound using a casting method,
forming a drain electrode and a source electrode on the active layer,
forming a gate insulating film on the active layer, the drain electrode and the source electrode, and
forming a gate electrode on the gate insulating film.

* * * * *